(12) United States Patent
Chirovsky et al.

(10) Patent No.: US 6,493,368 B1
(45) Date of Patent: Dec. 10, 2002

(54) LATERAL INJECTION VERTICAL CAVITY SURFACE-EMITTING LASER

(75) Inventors: Leo Maria Chirovsky, Bridgewater; Lucian Arthur D'Asaro, Madison; William Scott Hobson, Summit; John Lopata, North Plainfield, all of NJ (US)

(73) Assignee: Agere Systems Inc., Allentown, PA (US)

( * ) Notice: Subject to any disclaimer, the term of this patent is extended or adjusted under 35 U.S.C. 154(b) by 6 days.

(21) Appl. No.: 09/605,342

(22) Filed: Jun. 28, 2000

Related U.S. Application Data

(60) Provisional application No. 60/144,734, filed on Jul. 21, 1999.

(51) Int. Cl.[7] .................................................. H01S 5/00
(52) U.S. Cl. ........................... 372/46; 372/43; 372/44; 372/47; 372/48; 372/50; 372/107
(58) Field of Search ............................. 372/43, 46, 44, 372/47, 48, 50, 107

(56) References Cited

U.S. PATENT DOCUMENTS

| | | | |
|---|---|---|---|
| 5,245,622 A | 9/1993 | Jewell et al. .................. 372/45 |
| 5,469,458 A | 8/1994 | Takahiro ..................... 372/45 |
| 5,577,064 A | * 11/1996 | Swirhun et al. ............... 372/96 |
| 5,732,101 A | * 3/1998 | Shin .............................. 372/92 |
| 5,343,487 A | 9/1998 | Scott et al. .................... 372/46 |
| 6,044,100 A | 3/2000 | Hobson et al. ................ 372/46 |

FOREIGN PATENT DOCUMENTS

| | | | |
|---|---|---|---|
| NL | 1005570 | 9/1988 | ........... H01S/3/085 |

OTHER PUBLICATIONS

B. Ryvkin et al., *A New Type of Intracavity Electroabsorptive . . .*, Optics in Computing '98, P. Chavel et al., Editors, Jun. 17–29, 1998, Brugge, Belgium, Post–Deadline Papers.

* cited by examiner

*Primary Examiner*—Paul Ip
*Assistant Examiner*—Cornelius H. Jackson
(74) *Attorney, Agent, or Firm*—Michael J. Urbano

(57) ABSTRACT

A lateral injection VCSEL comprises upper and lower mirrors forming a cavity resonator, an active region disposed in the resonator, high conductivity upper and lower contact layers located on opposite sides of the active region, upper and lower electrodes disposed on the upper and lower contact layers, respectively, and on laterally opposite sides of the upper mirror, and a current guide structure including an apertured high resistivity layer for constraining current to flow in a relatively narrow channel through the active region, characterized in that a portion of the lower contact layer that extends under the top electrode has relatively high resistivity. This feature of our invention serves two purposes. First, it suppresses current flow in parallel paths and, therefore, tends to make the current density distribution in the aperture more favorable for the fundamental mode. Second, it reduces parasitic capacitance.

9 Claims, 3 Drawing Sheets

US 6,493,368 B1

LATERAL INJECTION VERTICAL CAVITY SURFACE-EMITTING LASER

CROSS-REFERENCE TO RELATED APPLICATIONS

This application claims priority from provisional application Serial No. 60/144,734 filed on Jul. 21, 1999.

1. Field of the Invention

This invention relates generally to lateral injection vertical cavity surface-emitting lasers (VCSELs) and, more particularly, to such lasers that provide for both improved current distribution and reduced parasitic capacitance.

2. Background of the Invention

A conventional lateral injection VCSEL as depicted in FIG. 1 comprises an active region 60 disposed in a cavity resonator formed by a pair of multi-layered mirrors 52 and 54. A current confinement structure 58 constrains current to flow in a relatively narrow channel through the active region. The structure 58 includes a high resistivity layer 57 having an aperture 59 through which current flows from an annular upper contact 54 to an annular lower contact 56. More specifically, as shown by the dashed lines 40 and 42, current flows from upper contact 54 into high conductivity layer 46, continues essentially horizontally along layer 46, then flows vertically through aperture 59 to high conductivity current return layer 62, and continues essentially horizontally along layer 62 to contact 56. In this symmetrical electrode configuration, the current flow paths 40 (i.e., those nearer to the edge of aperture 59) are shorter than paths 42 (i.e., those nearer to the center of aperture 59). Consequently, the current density is higher near the edges of the aperture than in the central portion of the aperture. This type of non-uniform current distribution favors higher order transverse optical modes, which have higher intensity near the edges of the aperture, over the fundamental transverse mode, which has its peak intensity in the center of the aperture. However, operating a VCSEL in the fundamental mode is generally preferred since this mode can be more efficiently coupled into other devices, optical fibers in particular.

This problem is recognized in the prior art as described by M. P. Creusen et al., Netherlands Patent No. 1005570 (hereinafter, Creusen) laid open to public inspection on Sep. 22, 1998. In order to make the current density distribution in the aperture more nearly uniform, Creusen proposes an asymmetric contact structure as shown in FIG. 1 of the patent. Upper contact (electrode) 13 is formed on upper contact layer 6 on one side of the mirror 1, and lower contact (electrode) 14 is formed on contact layer 7 on the laterally opposite side of the mirror 1. Creusen concludes that because the probability of all current paths through the active layer 5 is now the same, the homogeneity of the current injection will actually increase. As a result the higher order transverse modes is (sic) suppressed. This conclusion is flawed since it focuses on only the direct current paths through the aperture and neglects parallel paths through which the current flows. These parallel paths, where the current path may balloon in a longer, arc-like trajectory, do not all have the same length and, therefore, give rise to nonuniformity in the current density distribution in the aperture. These parallel paths exist because the top contact layer 6 and bottom contact layer 7 are not quite equipotentials, even if they are designed with a multiplicity of high and low doped layers in order to minimize the voltage drop across the device from upper contact 13 to lower contact 14. That Creusen uses this multiplicity of high and low doped layers to form the contact layers is clear from the cross-reference therein to the Jewell et al. U.S. Pat. No. 5,245,622, which is incorporated herein by reference.

Thus, a need remains in the art for a lateral injection VCSEL design that provides an improved current distribution in the aperture that favors the fundamental transverse mode over higher order modes.

In addition, the speed of operation of prior art lateral injection VCSELs, including those of Creusen, is limited by parasitic capacitance. The upper metal contact and the high conductivity semiconductor upper contact layer form one plate of the parasitic capacitor, and the lower metal contact and the high conductivity semiconductor lower contact layer form the other plate. The remaining semiconductor material in between (e.g., the high resistivity aperture layer, the active region) forms the dielectric of the capacitor. In lateral injection VCSELs the plates are typically closer together than in conventional (i.e., through-the-mirror injection) VCSELs, making the parasitic capacitance per unit area larger. The higher capacitance increases the RC time constant of these lasers and, therefore, increases their rise and fall time when they are turned on and off, which in turn limits their modulation speed.

Thus, a need remains in the art for a lateral injection VCSEL design that reduces parasitic capacitance and thereby improves its speed of operation.

SUMMARY OF THE INVENTION

In accordance with one aspect of our invention, a lateral injection VCSEL comprises upper and lower mirrors forming a cavity resonator, an active region disposed in the resonator, high conductivity upper and lower contact layers located on opposite sides of the active region, upper and lower electrodes disposed on the upper and lower contact layers, respectively, and on opposite sides of the upper mirror, and a current guide structure including an apertured high resistivity layer for constraining current to flow in a relatively narrow channel through the active region, characterized in that a portion of the lower contact layer that extends under the top electrode has relatively high resistivity. This feature of our invention serves two purposes. First, it suppresses current flow in parallel paths and, therefore, tends to make the current density distribution in the aperture more favorable for the fundamental mode. Second, it reduces parasitic capacitance.

In a preferred embodiment, the upper electrode is U-shaped (top view) with the mouth of the U facing the lower electrode. Likewise the high resistivity portion of the lower contact layer is also U-shaped and similarly oriented. Both surround a significant portion of the aperture and provide an opening that faces the lower electrode. Together, the U-shaped upper electrode and the U-shaped high resistivity portion of the lower contact layer define a high conductivity direct current path from the upper electrode through the aperture to the lower electrode.

In another preferred embodiment the high resistivity portion does not extend to the interior edges of the U-shaped upper contact; that is, the resistivity is patterned in such a way that a band or corridor of high conductivity is retained along the interior edges of the U-shaped electrode. This VCSEL design reduces parasitic capacitance by approximately an order of magnitude and prevents any significant increase in series resistance.

In yet another embodiment of our invention, the structure in which the upper and lower contact layers are formed is asymmetric with respect to the resonator axis, being wider on the side of the upper mirror where the upper electrode is located and narrower on the opposite side of the upper mirror. This feature further reduces parasitic capacitance.

BRIEF DESCRIPTION OF THE DRAWINGS

Our invention, together with its various features and advantages, can be readily understood from the following more detailed description taken in conjunction with the accompanying drawing, in which.

In addition, where applicable, when describing physical or optical dimensions, the symbol A stands for Angstroms, whereas when describing electric current, it stands for Amperes.

DETAILED DESCRIPTION OF THE INVENTION

General VCSEL Structure

Figure 1:
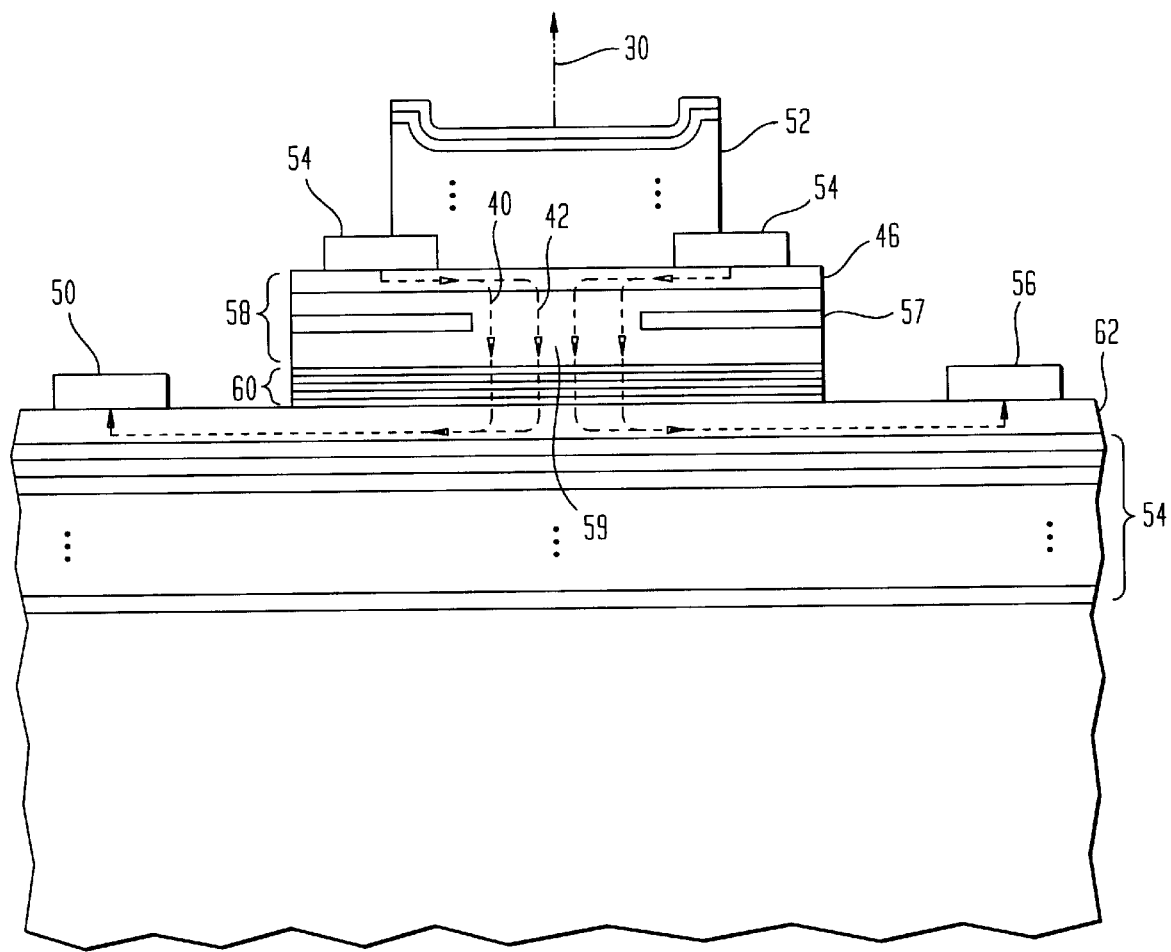
FIG. 1 is a schematic, cross sectional view of prior art lateral injection VCSEL.
Figure 2:
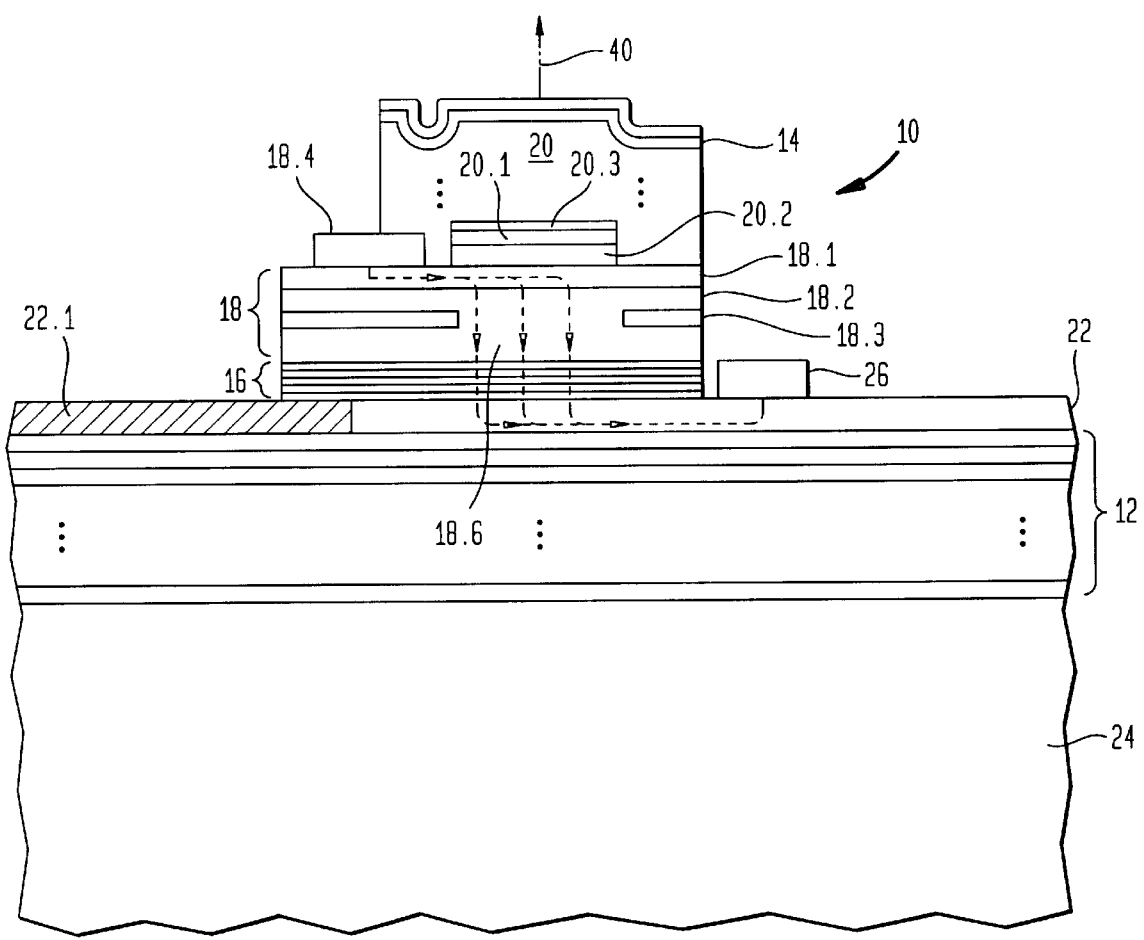
FIG. 2 is a schematic, cross sectional view of a lateral injection VCSEL in accordance with one embodiment of our invention.

With reference now to FIG. 2, a lateral injection VCSEL 10 comprises lower and upper multi-layered mirrors 12 and 14, respectively, forming an optical cavity resonator with its axis perpendicular to the layers. An active region 16 and a lensing structure 20 are disposed within the resonator and are oriented perpendicular to its axis. When suitably pumped, the active region generates stimulated emission of radiation (at a center wavelength $\lambda$) that propagates along the resonator axis and emerges from the resonator through one of the mirrors (e.g., upper mirror 14) as an output signal 40. The lensing structure 20, in the form of a relatively high refractive index mesa, serves to confine the transverse modes of the lasing radiation; i.e., viewed another way, it defines the beam waist of the radiation. The active region is pumped by means of a current guide structure 18 that includes a current confinement aperture 18.6. The combination of the active region 16 and the current guide structure 18 is referred to as the p-mesa, although it is not essential that the structure 18 be p-type and the active region 16 is commonly undoped.

The current guide structure 18 comprises a relatively high conductivity, upper contact layer 18.1, an upper electrode 18.4 formed on layer 18.1 on one side of upper mirror 14, a lower conductivity layer 18.2 beneath contact layer 18.1, and a high resistivity, ion-implanted region or zone 18.3 formed in the layer 18.2. Region 18.3 typically has an annular shape, the central opening of which forms the current confinement aperture 18.6. An overall effect of the guide structure 18 is that current from upper electrode 18.4 first flows essentially horizontally (i.e., perpendicular to the resonator axis) along a first path segment through layer 18.1. The ion-implanted region then causes the current to change directions and to flow essentially vertically (i.e., parallel to the resonator axis) along a second path segment through the upper portion of layer 18.2 to the aperture 18.6. At this point the current continues to flow essentially vertically through the active region 16, and completes its path to lower electrode 26 via a high conductivity, current return (or contact) layer 22 disposed between the active region 16 and the lower mirror 12. In contrast to upper electrode 18.4, lower electrode 26 is located on the laterally opposite side of upper mirror 14. Together the two form what is known as an asymmetric electrode configuration.

In order to accurately control implant depth, the region 18.3 is preferably implanted with relatively heavy ions (e.g. oxygen, fluorine) to a relatively shallow depth (e.g., 0.1–0.3 μm) below the top of upper contact layer 18.1. After ion-implantation, the structure is suitably annealed in order to remove shallow traps in layers 18.1 and 18.2, and yet retain deep traps that produce high resistivity in region 18.3. (See, S. J. Pearton et al. *Materials Research Society Symposium Proceedings,* Vol. 216, pp. 451–457 (1991), which is incorporated herein by reference.)

In addition, in order to facilitate the formation of the upper electrode 18.4 on the upper contact layer 18.1, which is typically relatively thin (e.g., a few 100 A), the layer 18.1 may be replaced by a composite of three sub-layers (not shown); namely, a relatively low conductivity layer sandwiched between a pair of higher conductivity layers, with the bottom sub-layer being located relatively far below (e.g., 1500 A) the top of the upper sub-layer where the electrode would be formed. The layer 18.3 then would be 2000–3000 A below the top of layer 18.1. The thickness and placement of the three layers are determined by the resonant cavity standing wave pattern; i.e., each high conductivity layer, typically a few 100 A thick, straddles a node (to reduce free-carrier absorption), and the thickness of the low conductivity layer is chosen so that the nodes are $N\lambda/2n$ apart, where N is positive integer and n is the effective refractive index of the active region.

The mirrors are illustratively multi-layered DBR reflectors comprising alternating sets of layers of different refractive index. As depicted, mirror 12 comprises alternating epitaxial layers of Group III–V compound semiconductor material, each layer being about $\lambda/4n_s$ thick, where $n_s$ is the refractive index of the corresponding layer of semiconductor mirror 12. Typically one set comprises layers of $Al_xGa_{1-x}As$ and the other set comprises layers of $Al_yGa_{1-y}As$, where x and y are different from one another. In contrast, mirror 14 comprises alternating layers of dielectric (i.e., non-epitaxial) material, each layer being about $\lambda/4n_D$ thick, where $n_D$ is the refractive index of the corresponding layer of dielectric mirror 14. Illustratively one set of layers comprises $TiO_2$ and the other set comprises $SiO_2$. Alternatively, one set comprises layers of a $MgF_2$—$CaF_2$ composite, whereas the other set comprises layers of ZnS. Composites with approximately a 95% $MgF_2$ and 5% $CaF_2$ by mole fraction in the layer are obtained by e-beam deposition from a eutectic melt comprising approximately 47% $MgF_2$ and 53% $CaF_2$ by weight or, equivalently, approximately 53% $MgF_2$ and 47% $CaF_2$ by mole fraction. See, copending application Ser. No. 08/997,710 filed on Dec. 23, 1997, which is incorporated herein by reference.

Alternatively, if the substrate 24 were removed after the other sections of the laser have been fabricated, then the mirror 12 could also comprise dielectric layers of the type described with reference to mirror 14. In this case, an output signal could emanate from both mirrors. Or, one or more pairs of one of the dielectric mirrors could be replaced with a high reflectivity metal (e.g., Au or Ag) coating, thus forcing the output signal to emanate only from the other mirror. The metal coating may also serve to reduce the topological profile of the device. The term substrate as used herein means any support member on which other layers of the laser are formed. For example, it might be a single crystal body on which epitaxial layers are grown, or it might be a combination of such a substrate and an epitaxial buffer layer.

The lensing structure 20 is at least partially embedded in the upper mirror 14; i.e., the mirror 14 overlays and directly contacts the structure 20. Thus, the diameter of the mirror 14 is larger than that of the structure 20, thereby serving to reflect at least a portion of any radiation that is outside the beam waist defined by the structure 20. Illustratively, structure 20 comprises a mesa formed by a relatively high refractive index layer 20.1 (e.g., $Al_zGa_{1-z}As$), and may also include an underlying stop-etch layer 20.2 (e.g., an InGaP layer) and an overlying protective layer 20.3 (e.g., a glass layer). The mole fraction z of Al in layer 20.1 is a function of the operating center wavelength of the laser (e.g., z=0 for operation at about 980 nm, and z=0.12 at about 850 nm). The cross-sectional shape of the mesa may be rectangular, as shown, or may be curved (e.g., convex with the mesa being thicker in the center and tapering to thinner at its edges). Preferably, one of the lower refractive index layers of the mirror 14 is located immediately adjacent the high refractive index layer 20.1 (or the protective layer 20.3, if used) of the mesa, and the refractive index of layer 20.1 should be greater than that of the immediately adjacent layer of the mirror.

The stop-etch layer 20.2 allows for controlled etching to expose the portions of upper contact layer 18.1 on which upper electrode 18.4 is formed. On the other hand, protective layer 20.3 ensures that the top surface of high index layer 20.1 remains optically smooth during various processing steps, and that the $N\lambda m/2n$ thickness discussed herein is preserved. To these ends, the protective layer 20.3 should be resistant to any chemicals used in subsequent processing steps (e.g., a developer used in a lift-off process or a chemical used in a cleaning step). In addition, it should have a refractive index similar to that of the adjacent low refractive index layer of mirror 14. Thin layers of glass, such as aluminum borosilicate glass (n=1.47) about 50–150 A thick, are particularly suitable for this purpose. The latter glass may be e-beam deposited from source material (e.g., about 1% $Al_2O_3$, 3% $B_2O_3$ and 96% $SiO_2$ by weight) commercially available from Corning Glassworks, Inc., Corning, N.Y. under the trademark VYCOR.

The active region 16 is disposed between the current guide structure 18 and the current return layer 22. The active region may be a single layer, but is preferably a well-known multi-quantum well (MQW) region comprising alternating layers of different bandgap; e.g., GaAs quantum well layers interleaved with AlGaAs barrier layers for operation at a center wavelength of about 850 nm. On the other hand, the layer 22 typically comprises n-type $Al_yGa_{1-y}As$, where y is chosen to reduce optical absorption at the center wavelength of the laser. Likewise, the semiconductor layers of current guide structure 18 may comprise $Al_yGa_{1-y}As$, but layer 18.1 is $p^{++}$-type and layer 18.2 is $p^-$- type (also known as π- type). Preferably, the total thickness of layer 22, active region 16, layers 18.1 and 18.2, and the lensing structure 20 together should be $N\lambda/2n$, as described above except that N>1. In order to reduce free-carrier absorption, the high conductivity, upper contact layer 18.1 is preferably located essentially at a node of the standing wave of the lasing radiation in the cavity resonator. On the other hand, in order to increase the interaction between the optical field of the radiation and the injected minority carriers the active region is preferably located essentially at an anti-node of the standing wave.

For operation at other center wavelengths the MQW active region would be made of different semiconductor materials such as InP and InGaAsP (e.g., for operation at about 1.3 μm or 1.5 μm), and the mirrors would have to be made of well-known materials that provide suitable reflectivity at those wavelengths. Similarly, for operation at about 0.98 μm the MQW active region could be made of InGaAs and GaAs, or of InGaAs and GaAsP.

A VCSEL of the type described above is fabricated by a sequence of process steps which produces lateral structural features that can be scaled reproducibly to smaller sizes than those of prior art VCSELs and that enables the lensing structure 20 to be formed before the mirror 14 is formed. Illustratively, the general process sequence includes the steps of providing a single crystal substrate 24, forming the mirror 12 on the substrate 24, forming the current return layer 22, forming the MQW active region 16, forming the current guide structure 18 on the active region, forming the lensing structure 20 on the current guide structure 18, forming electrodes 26 and 18.4 to the laser, and forming mirror 14 on top of the lensing structure 20. Illustratively, the mirror 12 is epitaxially grown, and the mirror 14 is e-beam deposited. Alternatively, both mirrors may be e-beam deposited.

Although a number of epitaxial growth techniques may be used to form the various semiconductor layers of the VCSEL, molecular beam epitaxy (MBE) and metal-organic chemical vapor deposition (MOCVD) are both well suited to the thickness control required for many of the extremely thin layers; e.g. the layers of mirror 12 and MQW active region 16. On the other hand, the dielectric (non-epitaxial) layers of mirror 14 are typically formed by e-beam deposition. See, for example, U.S. Pat. No. 5,206,871, granted to D. G. Deppe et al. on Apr. 27, 1993, which is incorporated herein by reference. Other techniques, such as sputtering or plasma deposition, may also be suitable.

A masking process can be used to define the current aperture 18.6 and the structure 20 as a self-aligned structure. That is, the same photoresist mask used to shield the aperture 18.6 from ion-implantation can also be used to etch the shape of the mesa, with the underlying stop-etch layer 20.2 facilitating the etching of the overlying high index layer 20.1. However, in some cases it may be advantageous to form the aperture 18.6 and the structure 20 with different diameters (i.e., a structure that is not self aligned).

On the other hand, a different masking process is employed to pattern the dielectric mirror 14. More specifically, a layer of photoresist (PR) is deposited on top of the wafer after the contacts have been formed. The thickness of the PR should be greater than the intended height of the mirror 14. A re-entrant opening is formed in the PR. Illustratively, the re-entrant opening has a trapezoidal cross-section with the top of the trapezoid corresponding to the top of the opening. The dielectric mirror is then deposited in the opening and on top of the PR. Lastly, the PR is lifted off by a suitable solvent, leaving the desired dielectric mirror on the top of the VCSEL.

PREFERRED EMBODIMENTS

In accordance with one aspect of our invention, the general lateral injection VCSEL structure described above is modified in order to provide a current distribution in the aperture that favors operation in the fundamental transverse mode and reduces parasitic capacitance.

One feature of our VCSEL involves the modification of current return layer 22 to provide a high resistivity portion 22.1 that extends under the upper electrode 18.4, as shown in FIG. 2. As with the current-aperture-defining layer 18.2, the portion 22.1 may be rendered highly resistive by implanting appropriate ions (e.g., helium) into layer 22.

Figure 3:
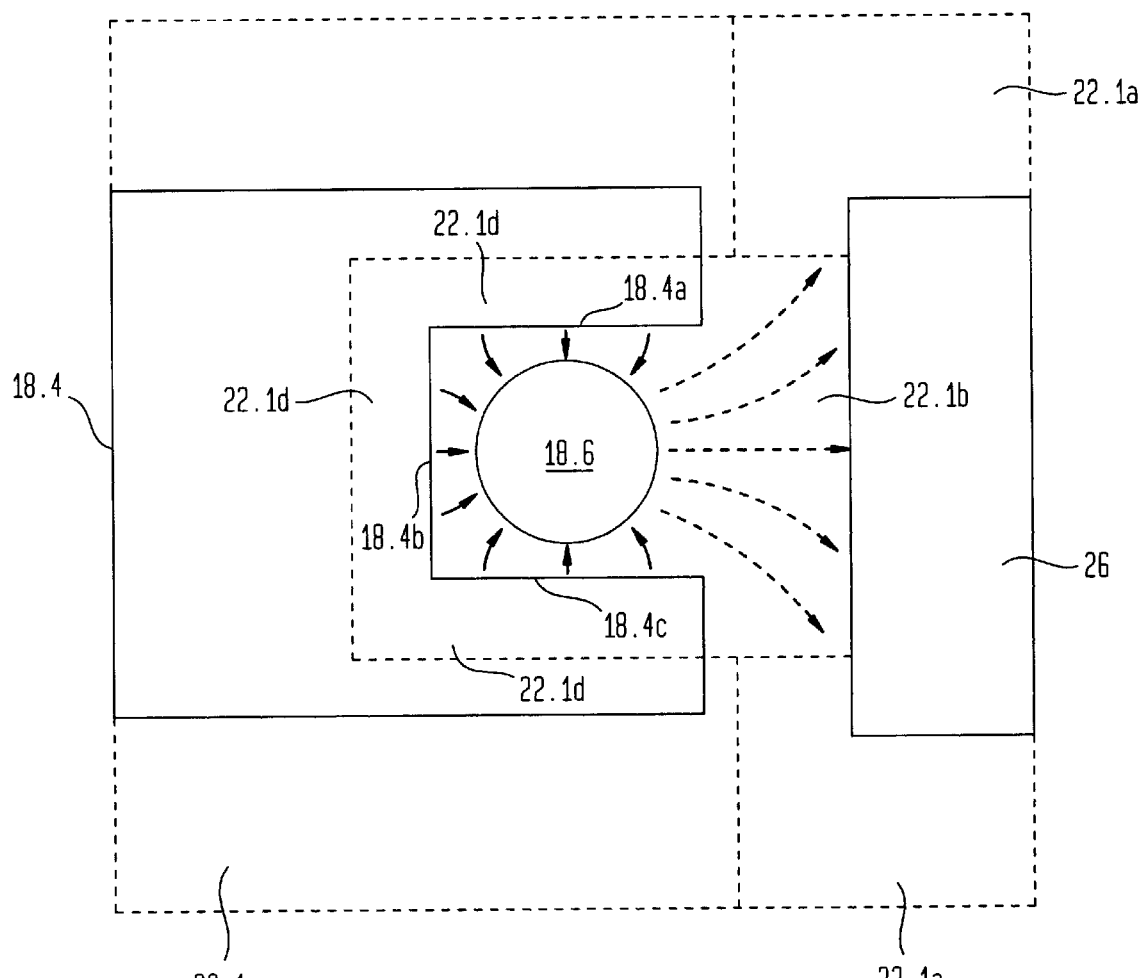
FIG. 3 is a schematic top view of the electrode, aperture and the lower contact layer in accordance with another embodiment of our invention. The p-mesa has been omitted for simplicity.

In a preferred embodiment, as shown in FIG. 3, upper electrode 18.4 is U-shaped with the mouth of the U facing the lower electrode 26. Likewise the high resistivity portion 22.1 is also U-shaped and similarly oriented. Both surround a significant portion of the aperture 18.6 (e.g., 270 degrees of arc) and provide an opening that faces the lower electrode 26. Together, the electrode 18.4 and the portion 22.1 define a high conductivity direct current path 22.1b from the upper electrode 18.4, through the aperture 18.6 to the lower electrode 26.

In another preferred embodiment the high resistivity portion 22.1 does not extend to the interior edges of the upper contact 18.4; that is, the ion implantation is patterned in such a way that a band or corridor 22.1d of high conductivity is retained along the interior edges 18.4a, 18.4b and 18.4c. Typically, this corridor is about 2 $\mu$m wide. This design reduces parasitic capacitance by approximately an order of magnitude. In addition, the corridor provides electrical contact between the upper electrode 18.4 and the upper contact layer 18.1, thereby preventing any significant increase in the contact (series) resistance between them.

Figure 4:
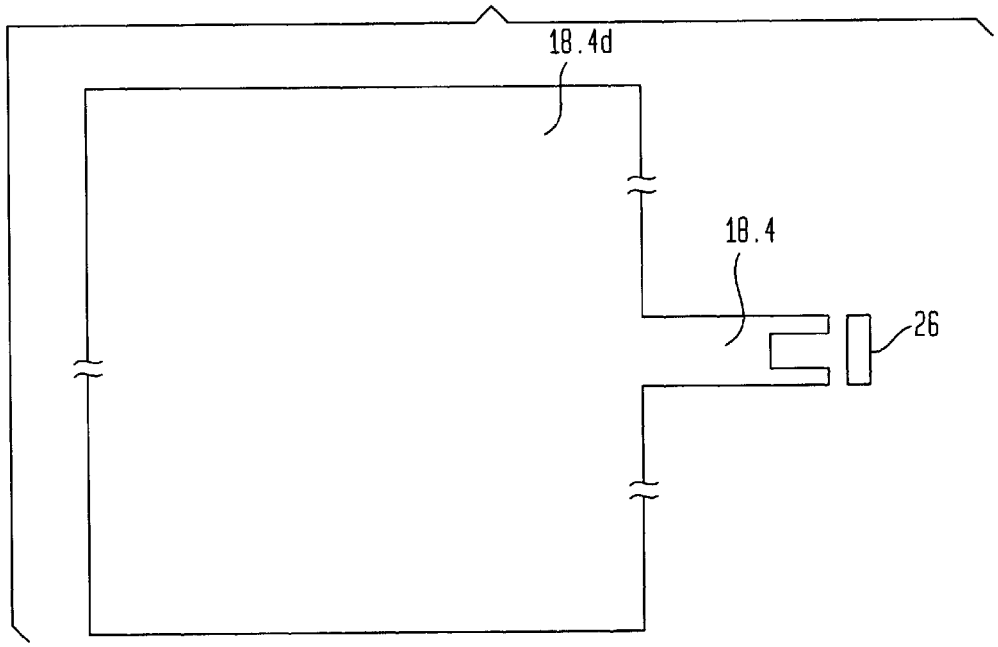
FIG. 4 is a schematic top view of the electrodes of FIG. 3 and, in addition, a bond pad connected to the U-shaped electrode.

Alternatively, to further reduce parasitic capacitance, any of the remaining regions of current return layer 22 (i.e., those outside of direct current path 22.1b and lower electrode 26) may also be rendered highly resistive. Regions 22.1a illustrate this alternative in FIG. 3. In addition, FIG. 4 illustrates another application of this alternative in which the portion of the current return layer (not shown) under the bond pad 18.4d is also implanted so as to render it highly resistive. Moreover, as shown in FIG. 2, parasitic capacitance is also reduced by making the p-mesa (i.e., the current guide structure 18 and the active region 16) asymmetric, being wider (as measured from the resonator axis) on the side of the upper mirror 14 where upper electrode 18.4 is located and narrower on the laterally opposite side of the upper mirror.

Finally, we note that the implantation step used to render portions of the current return layer highly resistive could also be used to form isolation regions between individual VCSELs in an array.

EXAMPLE

The following example describes the fabrication of a lateral injection VCSEL of the type depicted in FIGS. 2–3. Although the fabrication of a single device is described, it will be understood, of course, that typically an array of devices is formed on a single wafer. The various material, dimensions, and other parameters are provided by way of illustration only and, unless otherwise expressly indicated, are not intended to limit the scope of the invention. MOCVD was used to grow all of the semiconductor layers. P-type layers were doped with C, whereas n-type layers were doped with Si. The term undoped epitaxial layer as used herein generally means that the layer was not intentionally doped, but may have been subject to low level doping from background dopants in the growth chamber.

The VCSEL 10 was designed for operation for bottom emission at a free-space center wavelength of about 964 nm, a threshold current of about 1 mA, an operating current of about 3–5 mA, and a power dissipation of about 5–10 mW. To this end the laser comprised: an undoped single crystal GaAs substrate obtained from commercial sources; a DBR mirror 12 including 20 pairs of undoped GaAs/AlAs layers each about 696 A/829 A thick, respectively; an n-type GaAs current-return region 22 about 1492 A thick with a carrier concentration of about $3 \times 10^{18}$ cm$^{-3}$; an n-type Al$_{0.3}$Ga$_{0.7}$As lower current confinement layer (not shown) about 1046 A thick with a carrier concentration of about $1 \times 10^{18}$ cm$^{-3}$; an MQW active region 16 comprising 4 GaAs$_{0.85}$P$_{0.15}$ barrier layers each about 100 A thick interleaved with 3 undoped In$_{0.2}$Ga$_{0.8}$As quantum well layers each about 80 A thick; a multi-layered, p-type Al$_{0.3}$Ga$_{0.7}$As upper current confinement region (not shown) about 3216 A thick with its carrier concentration graded from about $0.2 \times 10^{18}$ cm$^{-3}$ to about $10 \times 10^{18}$ cm$^{-3}$; an upper contact layer formed by three sub-layers; i.e., a pair of p-type GaAs layers each about 300 A thick with a carrier concentration of about $10 \times 10^{19}$ cm$^{-3}$ sandwiching a $\pi$-type GaAs layer about 1092 A thick with a carrier concentration of about $1 \times 10^{18}$ cm$^{-3}$; a region 18.3 implanted with oxygen ions (at 170 keV and a dose of $6 \times 10^{12}$ cm$^{-2}$) to a depth of about 0.28–0.30 $\mu$m below the top of layer 18.1 and forming a circular current aperture 18.6 about 6 $\mu$m in diameter; a p$^{++}$-type GaAs layer 18.1 about 300 A thick and doped with C to about $10^{20}$ cm$^{-3}$; an undoped In$_{0.5}$Ga$_{0.5}$P layer 20.2 about 200 A thick; an undoped GaAs layer 20.1 about 300 A thick; and an aluminum borosilicate glass protective layer 20.3 about 80 A thick.

In order to remove shallow traps in layers 18.1 and 18.2, the structure was annealed at about 500° C. for about 20 min.

In order to reduce parasitic capacitance and to improve the current density distribution in the aperture 18.6, the current return layer 22 was pattern implanted with helium ions (at 160 keV and a dose of $6 \times 10^{14}$ cm$^{2}$) to form U-shaped high resistivity portion 22.1.

The current guide structure 18 was patterned and etched through the active region to expose the portion of the current return layer 22 on which lower electrode 26 was later formed and to remove excess material and further reduce parasitic capacitance. This etching step removed about 0.6–0.7 $\mu$m of semiconductor material from the right hand side of structure 18, thus making the asymmetric structure shown in FIG. 2.

The two electrodes, as shown in FIG. 3, were deposited by conventional e-beam evaporation and patterning techniques to form the U-shaped electrode 18.4 as a p-type ohmic contact and the rectangular electrode 26 as an n-type ohmic contact.

After the electrodes were deposited, an aluminum borosilicate glass protective layer 15 was deposited on the semiconductor surface on which dielectric mirror 14 was to be subsequently formed in order to protect the surface from attack by the PR developer described below. The protective layer 15, which was about 80 A thick and had a refractive index of about 1.47, was e-beam deposited from a source comprising approximately 1% Al$_2$O$_3$, 3% B$_2$O$_3$ and 96% SiO$_2$ Then, the dielectric mirror 14 was deposited by e-beam evaporation and patterned by a lift-off technique.

The mirror 14 included 9 pairs of layers, one layer of each pair comprising TiO$_2$ having a thickness of about 1141 A and the other comprising SiO$_2$ having a thickness of about 1704 A.

In operation, VCSELs in accordance with our invention exhibited improved CW characteristics and higher modulation speeds. We measured the small signal modulation response at various bias currents. The lasers exhibited a 3-dB bandwidth of ~4 GHz at 2 mA, ~6 GHz at 2.4 mA, ~9 GHz at 3.4 mA, and 10.5 GHz at 4.2 mA. In addition, the modulation conversion efficiency factor (MCEF) was approximately 6.5 GHz/mA. The parasitic (3-dB) cutoff frequency was about 20 GHz, a relatively high figure that indicates the effectiveness of our design in reducing parasitic capacitance.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

In particular, both mirrors 12 and 14 may be made of dielectric layers. In this design, all of the semiconductor layers (e.g., current return layer 22, active region 16, current guide layers 18.1 and 18.2, and lensing structure 20) would first be grown on the substrate, the current guiding and lensing structures would be formed, the contacts would be made, and mirror 14 would be deposited as described above. Then, the substrate would be removed (e.g., by a suitable etching technique), and mirror 12 would be deposited on the exposed layer 22, again using the process described above. Instead of removing the entire substrate, an opening may be formed therein exposing a portion of the current return layer 22. The mirror 12 would then be deposited in the opening.

In addition, the well-known technique of delta-doping may be utilized to dope any of the semiconductor layers, especially those that have high levels of carrier concentration (e.g., layers 18.1 and 22). Moreover, the conductivity types of the various layers could be reversed; e.g., the current guide structure 18 could be n-type instead of the p-type and the current return layer 22 could p-type instead of n-type.

What is claimed is:

1. A lateral injection VCSEL comprising
   upper and lower multi-layered mirrors forming a cavity resonator having a resonator axis perpendicular to said layer,
   an active region disposed within said resonator,
   a current guide structure for directing current through an aperture to said active region to generate stimulated emission of radiation that propagates along said axis, a portion of said radiation forming an output signal which emerges from said resonator, said structure including high conductivity upper and lower contact layers located on opposite sides of said active region,
   upper and lower electrodes disposed on said upper and lower contact layers, respectively, and on laterally opposite sides of said upper mirror, characterized on that
   a lateral portion of said lower contact later that extends under said upper electrode has relatively high resistivity, the remaining lateral portion of said lower contact layer having said high conductivity.

2. The invention of claim 1 wherein said upper electrode and said high resistivity portion are U-shaped, both surrounding a significant portion of said aperture and providing an opening that faces said lower electrode, thereby defining a high conductivity direct current path from said upper electrode through said aperture to said lower electrode.

3. The invention of claim 2 wherein said high resistivity portion extends only part way under said U-shaped upper electrode, thereby leaving a high conductivity corridor along the interior edges of said electrode.

4. The invention of claim 3 wherein said corridor is about 2 μm wide.

5. The invention of claim 1 wherein said upper electrode includes a bond pad and said high resistivity portion also extends under said bond pad.

6. The invention of claim 1 wherein said structure is asymmetric with respect to said resonator axis, being wider on the side of said upper mirror where said upper electrode is located and narrower on the opposite side of said upper mirror.

7. The invention of claim 1 wherein said high resistivity portion is implanted with helium ions.

8. A lateral injection VCSEL comprising
   a lower DBR mirror comprising interleaved sets of $Al_xGa_{1-x}As$ and $Al_yGa_{1-y}As$ layers of different refractive index and an upper DBR mirror comprising interleaved sets of dielectric layers of different refractive index, said mirrors forming a cavity resonator having a resonator axis perpendicular to said layers,
   a MQW active region disposed within said resonator,
   a current guide structure for directing current through a current aperture to said active region to generate stimulated emission of radiation which propagates along said axis a portion of said radiation forming an output signal which emerges through at least one of said mirrors, said structure including high conductivity upper and lower contact layers located on opposite sides of said active region, upper and lower electrodes disposed on said upper and lower contact layers, respectively, and on laterally opposite sides of said upper mirror and means for controlling the flow of current from said upper electrode along a first path segment which is essentially perpendicular to said axis and from said first segment along a second path segment essentially parallel to said axis and then through said current aperture to said active region, said controlling means including a multilayer stack disposed between said upper electrode and said current aperture, said stack comprising a relatively high conductivity first layer located at essentially a node of the standing wave of said radiation in said resonator, a lower conductivity second layer adjacent said first layer, and an ion-implanted zone disposed in said second layer and having an opening forming said current aperture, and
   a lensing structure in the form of a relatively high refractive index mesa disposed transverse to said axis and aligned with said current aperture, said mesa being at least partially embedded in said second mirror and comprising an $Al_zGa_{1-z}As$ layer a protective glass layer overlaying said $Al_zGa_{1-z}As$ layer and disposed adjacent said mirror, and an InGap layer underlying said $Al_zGa_{1-z}As$ layer, the diameter of said upper mirror being larger than the diameter of said mesa, characterized in that
   a portion of said lower contact layer that extends under said upper electrode has relatively high resistivity,
   said upper electrode and said high resistivity portion are U-shaped, both surrounding a significant portion of said aperture and providing an opening that faces said lower electrode, thereby defining a high conductivity direct current path from said upper electrode through said aperture to said lower electrode,
   said high resistivity portion extends only part way under said U-shaped upper electrode, thereby leaving a high conductivity corridor along the interior edges of said upper electrode, and
   said current guide structure is asymmetric with respect to said resonator axis being wider on the side of said upper mirror where said upper electrode is located and narrower on the laterally opposite side of said upper mirror.

9. The invention of claim 8 wherein said upper electrode includes a bond pad and said high resistivity portion also extends under said bond pad.

* * * * *